(12) United States Patent
Yao et al.

(10) Patent No.: US 9,147,743 B2
(45) Date of Patent: Sep. 29, 2015

(54) HIGH ELECTRON MOBILITY TRANSISTOR STRUCTURE WITH IMPROVED BREAKDOWN VOLTAGE PERFORMANCE

(71) Applicant: TAIWAN SEMICONDUCTOR MANUFACTURING COMPANY, LTD., Hsinchu (TW)

(72) Inventors: Fu-Wei Yao, Hsinchu (TW); Chun-Wei Hsu, Taichung (TW); Chen-Ju Yu, Jiaoxi Township (TW); Jiun-Lei Jerry Yu, Zhudong Township (TW); Fu-Chih Yang, Fengshan (TW); Chih-Wen Hsiung, Hsinchu (TW); King-Yuen Wong, Tuen Mun (HK)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/185,231

(22) Filed: Feb. 20, 2014

(65) Prior Publication Data
US 2014/0170819 A1    Jun. 19, 2014

Related U.S. Application Data

(62) Division of application No. 13/354,768, filed on Jan. 20, 2012, now Pat. No. 8,680,535.

(51) Int. Cl.
*H01L 21/338*    (2006.01)
*H01L 29/66*    (2006.01)
(Continued)

(52) U.S. Cl.
CPC ...... *H01L 29/66462* (2013.01); *H01L 29/2003* (2013.01); *H01L 29/402* (2013.01); *H01L 29/7787* (2013.01)

(58) Field of Classification Search
CPC ............... H01L 29/2003; H01L 2924/00014; H01L 29/66462; H01L 21/0254; H01L 29/7787
USPC .............................. 438/172, 285; 257/76, 194
See application file for complete search history.

(56) References Cited

U.S. PATENT DOCUMENTS

| | | | |
|---|---|---|---|
| 8,309,987 B2 | 11/2012 | Derluyn et al. | |
| 2011/0049529 A1* | 3/2011 | Sato et al. | 257/76 |

(Continued)

FOREIGN PATENT DOCUMENTS

| | | |
|---|---|---|
| JP | 2010-45343 | 2/2010 |
| JP | 2010-251370 | 11/2010 |

(Continued)

OTHER PUBLICATIONS

Notice of Allowance dated Jun. 17, 2014 and English translation from corresponding No. KR 10-2012-0136984.

(Continued)

*Primary Examiner* — Andy Huynh
(74) *Attorney, Agent, or Firm* — Lowe Hauptman & Ham, LLP

(57) ABSTRACT

A method comprises epitaxially growing a gallium nitride (GaN) layer over a silicon substrate, epitaxially growing a donor-supply layer over the GaN layer, and etching a portion of the donor-supply layer. The method also comprises depositing a passivation layer over the donor-supply layer and filling the etched portion of the donor-supply layer, forming a source and a drain on the donor-supply layer, and forming a gate structure between the source and the etched portion of the donor-supply layer. The method further comprises depositing contacts over the gate structure, the source, and the drain.

20 Claims, 12 Drawing Sheets

(51) Int. Cl.
*H01L 29/40* (2006.01)
*H01L 29/778* (2006.01)
*H01L 29/20* (2006.01)

(56) References Cited

U.S. PATENT DOCUMENTS

| | | |
|---|---|---|
| 2011/0272743 A1 | 11/2011 | Hwang et al. |
| 2012/0153390 A1* | 6/2012 | Mishra et al. ............... 257/339 |
| 2012/0217546 A1* | 8/2012 | Machida et al. ............ 257/194 |
| 2013/0134435 A1 | 5/2013 | Yu et al. |
| 2013/0134482 A1 | 5/2013 | Yu et al. |
| 2014/0004669 A1* | 1/2014 | Oka ............................ 438/172 |

FOREIGN PATENT DOCUMENTS

| | | |
|---|---|---|
| KR | 10-2011-0105032 | 9/2011 |
| KR | 10-2011-0122525 | 11/2011 |

OTHER PUBLICATIONS

Office Action dated Nov. 28, 2013 and English translation from corresponding application No. KR 10-2012-0136984.

* cited by examiner

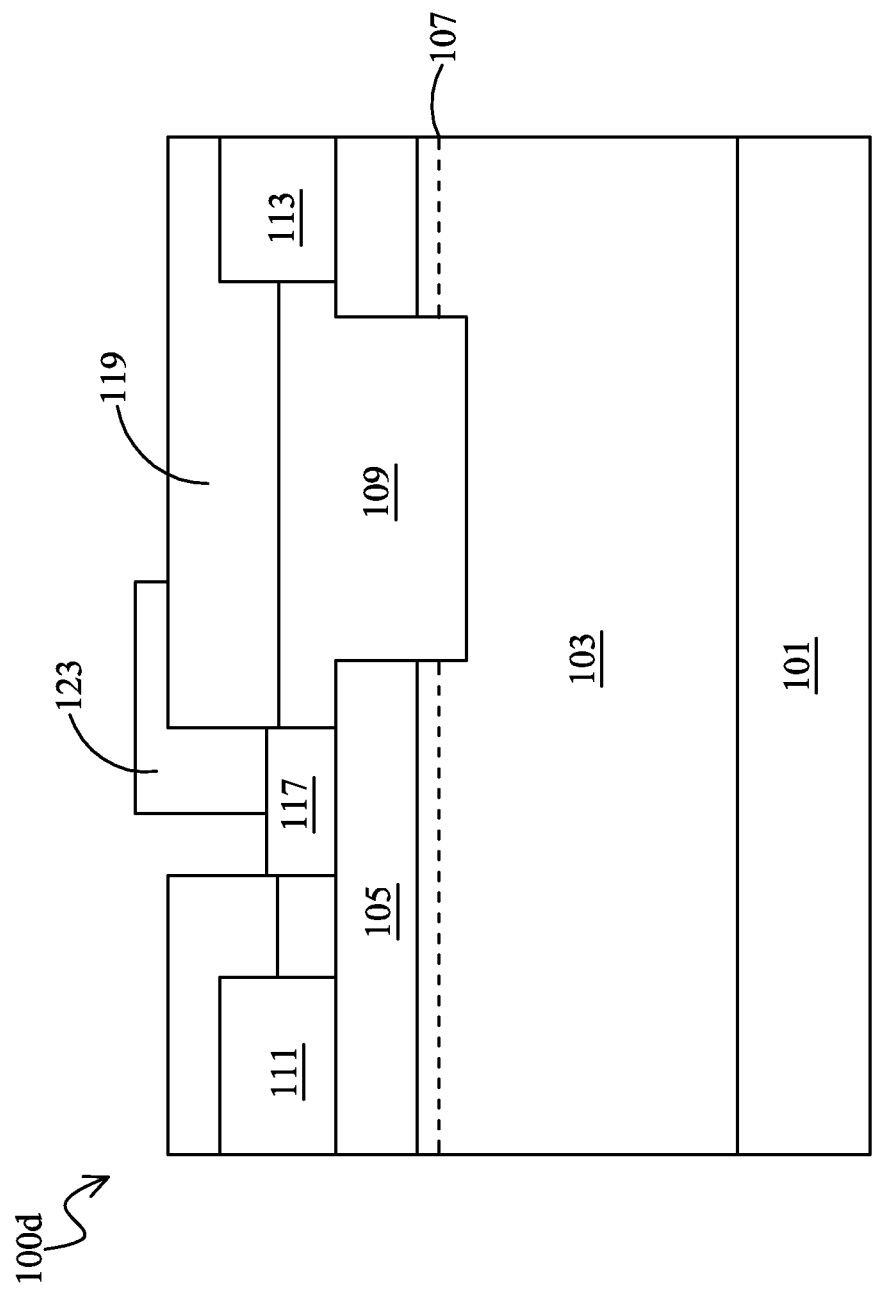

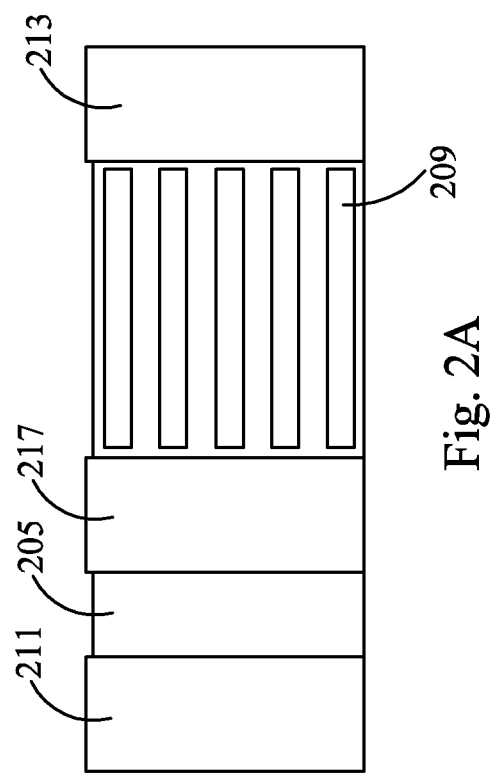
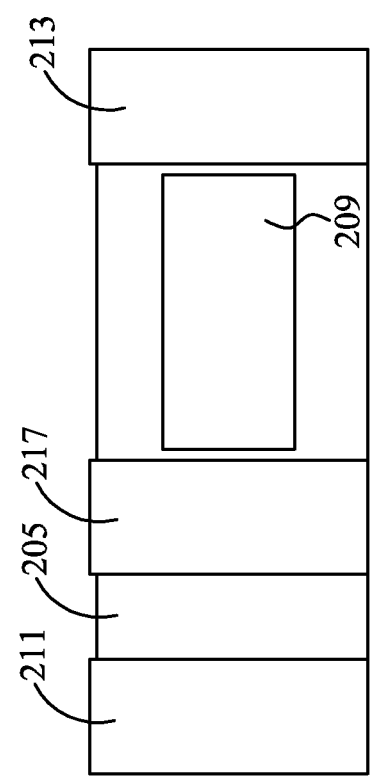
Fig. 2A
Fig. 2B

HIGH ELECTRON MOBILITY TRANSISTOR STRUCTURE WITH IMPROVED BREAKDOWN VOLTAGE PERFORMANCE

PRIORITY CLAIM

The present application is a divisional of U.S. application Ser. No. 13/354,768, filed Jan. 20, 2012, which claims priority of U.S. Provisional Patent Application No. 61/579,903, filed Dec. 23, 2011, which are incorporated herein by reference in their entireties.

BACKGROUND

Group-III group-V compound semiconductors (often referred to as III-V compound semiconductors), such as gallium nitride (GaN) and its related alloys, have been under intense research in recent years due to their promising applications in electronic and optoelectronic devices. The large band gap and high electron saturation velocity of many III-V compound semiconductors also make them excellent candidates for applications in high temperature, high voltage, and high-speed power electronics. Particular examples of potential electronic devices employing III-V compound semiconductors include high electron mobility transistor (HEMT) and other heterojunction bipolar transistors.

During operation, a HEMT forms a large surface electric field around the gate edge, which affects the depletion region curve in a drift region between the gate structure and the drain. While a large electric field is one of the benefits of HEMT for use in power applications, the shape and size of the depletion region during operation can negatively affect the breakdown voltage for the device. When negative bias is applied to the gate of the HEMT, a depletion region curve is formed directly under the gate and causes a high surface electric field around the gate. The electric field concentration around the gate decreases breakdown voltage.

In order to decrease breakdown voltage, a metallic field plate is sometimes added over or next to the gate structure over a passivation layer between the gate structure and the drain. The field plate modulates the surface electric field distribution and enhances the breakdown voltage. However, new structures with high breakdown voltage for III-V compound semiconductor based transistors and methods for forming them continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 1D are cross sectional views of a high electron mobility transistor (HEMT) structure in accordance with various embodiments of the present disclosure.

FIGS. 2A to 2B are top views of a portion of HEMT structure of FIG. 1A from view plane 110 of FIG. 1A in accordance with various embodiments of the present disclosure.

DETAILED DESCRIPTION

Figure 1A:
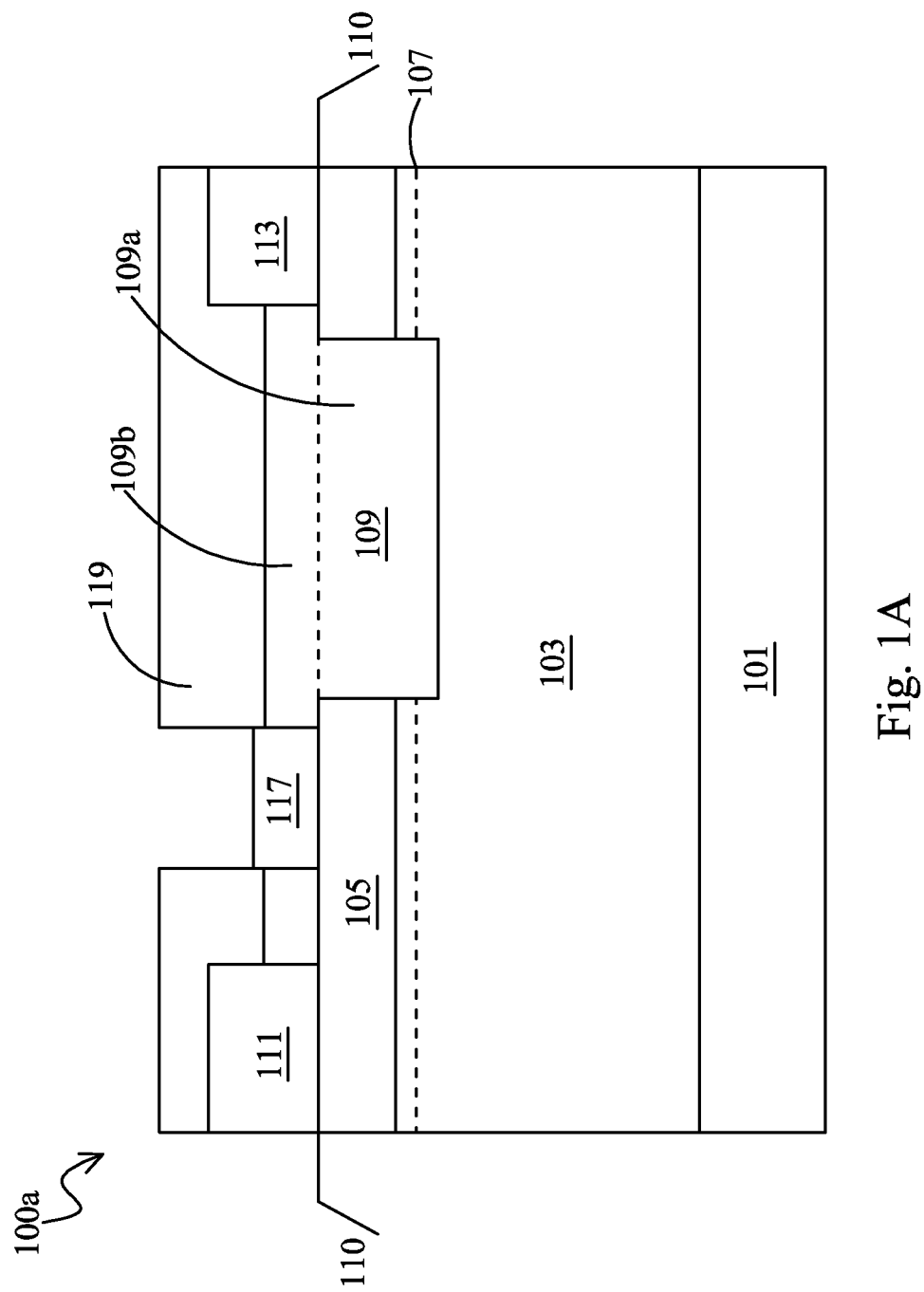

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A novel structure for group-III group-V (referred to as III-V hereinafter) semiconductor based transistors and methods for forming the structures are provided. Throughout the description, the term "III-V compound semiconductor" refers to compound semiconductor materials comprising at least one group III element and one group V element. The term "III-N compound semiconductor" refers to a III-V compound semiconductor in which the group V element is nitrogen. Example stages of manufacturing an illustrative embodiment of the present disclosure are disclosed. Those skilled in the art will recognize that other manufacturing steps may need to take place before or after the described stages in order to produce a complete device. Other stages of manufacturing that may be substituted for some of the example stages may be discussed. Those skilled in the art will recognize that other substitute stages or procedures may be used. Throughout the various views and illustrative embodiments of the present disclosure, like reference numbers are used to designate like elements.

The present disclosure provides a structure and a method to form III-V compound semiconductor-based transistors having a high breakdown voltage. FIGS. 1A to 1D show various example power transistor devices 100a to 100d according to various embodiments of the present disclosure. The power transistor device may be a high electron mobility transistor (HEMT). These power transistor devices use a restricted carrier channel layer that reduces current flow in a drift region of the device. The restricted carrier channel is formed by selectively removing one or more portions of the donor-supply layer and filling the space with passivation material so that a carrier channel layer does not form directly under the removed portions. These one or more portions may be through-holes or have not enough donor-supply layer material remaining to form a carrier channel layer. The passivation material has a lower dielectric constant than the material it replaces. In most cases, the passivation material has a dielectric constant less than about 9. This structure has a higher breakdown voltage threshold than a comparative structure without the restricted carrier channel layer.

Referring to FIG. 1A, the power transistor device 100a is formed over a silicon substrate 101. A number of layers are grown over a substrate 101 using an epitaxial process. The layers include an optional nucleation layer of aluminum nitride layer (not shown), an optional buffer layer (not shown), and a bulk gallium nitride layer 103, which may be grown over the buffer layer or directly on a substrate. The bulk gallium nitride (GaN) layer 103 is a channel layer for the HEMT 100a.

FIG. 1A shows an active layer 105 on top of the bulk GaN layer 103. The active layer 105, also referred to as donor-supply layer, is grown on the channel layer 103. An interface is defined between the channel layer 103 and the donor-supply layer 105. A carrier channel 107 of two-dimensional electron gas (2-DEG) is located at the interface. In at least one embodiment, the donor-supply 105 is an aluminum gallium nitride (AlGaN) layer (also referred to as the AlGaN layer 105). The AlGaN layer 105 has a formula of $AlGa_xG_{(1-x)}N$, wherein x varies between about between about 10% to 100%. It has a thickness in a range from about 5 nanometers to about 50 nanometers. In other embodiments, the donor-supply layer 105 may include an AlGaAs layer, or AlInP layer.

A band gap discontinuity exists between the AlGaN layer 105 and the GaN layer 103. The electrons from a piezoelectric effect in the AlGaN layer 105 drop into the GaN layer 103, creating a very thin layer 107 of highly mobile conducting electrons in the GaN layer 103. This thin layer 107 is referred to as a two-dimensional electron gas (2-DEG), forming a carrier channel (also referred to as the carrier channel 107). The thin layer 107 of 2-DEG is located at an interface of the AlGaN layer 105 and the GaN layer 103. Thus, the carrier channel has high electron mobility because the GaN layer 103 is undoped or unintentionally doped, and the electrons can move freely without collision or substantially reduced collision with the impurities.

A source feature 111 and a drain feature 113 are disposed on the AlGaN layer 105 and configured to electrically connect to the carrier channel 107. Each of the source feature and the drain feature comprises a corresponding intermetallic compound. The intermetallic compound is may be embedded in the AlGaN layer 105 and may be further embedded in a top portion of the GaN layer 103. In one example, the intermetallic compound comprises Al, Ti, or Cu. In another example, the intermetallic compound comprises AlN, TiN, $Al_3Ti$ or AlTiN.

The semiconductor structure 100a also includes a gate structure 117 disposed on the AlGaN layer 105 between the source 111 and drain 113 features. The gate 117 includes a conductive material layer which functions as the gate electrode configured for voltage bias and electrical coupling with the carrier channel 107. In various examples, the conductive material layer may include a refractory metal or its compounds, e.g., tungsten (W), titanium nitride (TiN) and tantalum (Ta). Other commonly used metals in the conductive material layer include nickel (Ni) and gold (Au). The gate structure may include one or many layers.

According to various embodiments of the present disclosure, a passivation material 109 covers a drift region of the donor-supply layer 105 between the gate structure 117 and drain 113. Passivation material 109 includes a first portion 109a, also referred to as buried portion 109a, and a second portion 109b, also referred to as a top portion 10b. The buried portion 109a fills one or more through-holes or near through-holes in the donor-supply layer 105. In FIG. 1A, the buried portion 109a contacts the underlying bulk GaN layer 103. The top portion 105 of the passivation material 109b has a relatively constant height, which also may be referred to as a top thickness. The carrier channel 107 has patches of non-conduction where the buried portion 109a of the passivation material contacts the bulk GaN layer 103. As a result, the total current for the power transistor device during operation is reduced and resistance between the drain and source is increased, but the breakdown voltage threshold increases.

The passivation material 109 may be silicon oxide, silicon nitride, silicon oxynitride, carbon doped silicon oxide, carbon doped silicon nitride, carbon doped silicon oxynitride, zinc oxide, zirconium oxide, hafnium oxide or titanium oxide. The dielectric layer is deposited using a process such as chemical vapor deposition (CVD). A dielectric material 119 over the passivation material 109 covers the source 111 and drain 113.

Figure 1B:
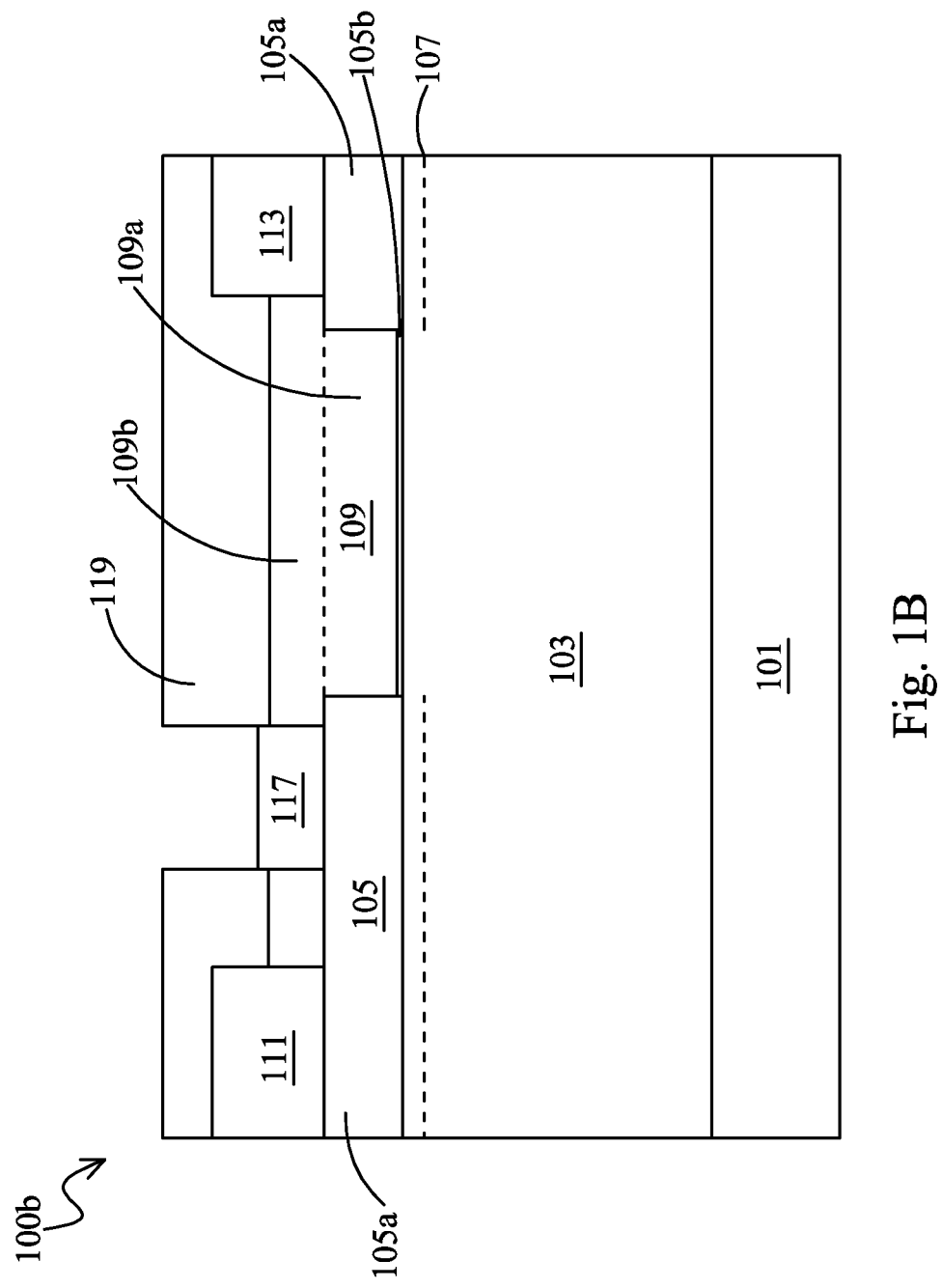

In other embodiments, such as power transistor device 100b shown in FIG. 1B, the buried portion 109a does not contact the underlying bulk GaN layer 103. Only a very thin layer of the donor-supply layer remains over the bulk GaN layer 103, shown as 105b in FIG. 1B. In these embodiments, the very thin layer 105b of the donor-supply layer 105 has a thickness of about 3 nm or less, such that the buried portion 109a is said to be almost contacting the underlying bulk GaN layer 103. This very thin layer 105b is not enough to form a carrier channel layer 107 with the underlying bulk GaN layer 103, and the carrier channel layer 107 is also discontinuous as shown in FIG. 1B.

Figure 1C:
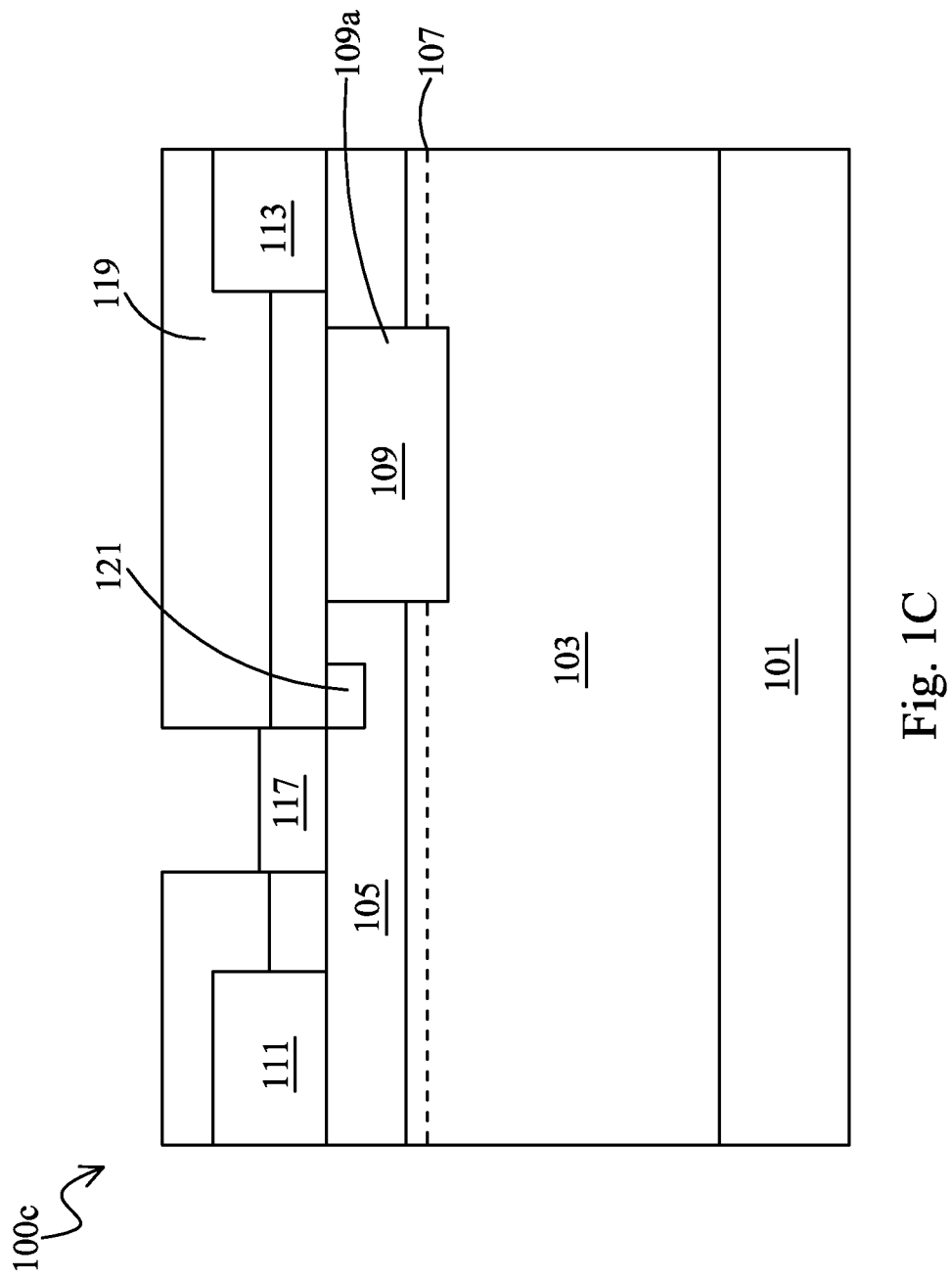

In yet other embodiments, the power transistor device may include additional features that modulate the surface electric field at the gate edge. As shown in FIG. 1C for device 100c, an additional passivation material 121 is deposited beneath the gate 117 edge. Used in conjunction with buried passivation material 109a, the maximum surface electric field which usually occurs at the gate edge is also reduced. Another example of gate edge surface electric field modulation is the use of field plates. FIG. 1D shows an example power device 100d having a field plate 123 formed over the gate 117 edge. The field plate is formed of metal and its proximity to the gate edge reduces the maximum surface electric field at the gate edge.

While FIGS. 1A to 1D show one buried portion 109a, the passivation material 109 may include one or many buried portions 109a as shown in FIG. 2A. FIGS. 2A and 2B are example top views of various buried portions 209 in accordance with various embodiments of the present disclosure. The top views shows the HEMT 100a of FIG. 1A cut from line 110. Line 110 separates the passivation material 109 into top portions and buried portions.

FIG. 2A shows a total of five buried portions 209 in the drift region. Five buried portions 209 are dispersed between the gate structure 217 and drain 213, although fewer or more buried portions may be used. The buried portions 209 create non-conductive patches in the conductive surface of the carrier channel layer below. The surface area of the buried portion 209 is more than about 10% and is not greater than about 50% of the total surface area between the gate 217 and drain 213. While larger surface area of the buried portion 209 can be created and used, the on-state current may be sufficiently reduced such that any breakdown voltage gain is not worth the loss in transistor performance. Another way to review this limitation is the effective width of the carrier channel layer. Because patches of non-conduction are inserted, the effective width is reduced by the total width of the buried portions 209. In other words, a minimum width of the carrier channel layer is about 50% to about 90% of the width of the bulk GaN layer.

FIG. 2B shows a single buried portion 209 in the center of the drift region as another example. This design is simpler to implement and may be easier to fill depending on the overall geometry of the device. A ratio of a buried portion and adjacent drift region that does not include buried portion may be may be about 1:1 to about 1:9.

The various buried portions shown in FIGS. 2A and 2B are merely examples. The buried portions may be polygons, such as quadrilaterals shown in figures. The buried portions may have more than four sides or may be circular or irregular. For geometries that have a varying carrier channel width, the minimum width rule of having about 50% to about 90% of the width of the bulk GaN layer applies. In other words, the buried portions 209 of the passivation material can only reduce the carrier channel width by about 10% to about 50%.

Figure 3:
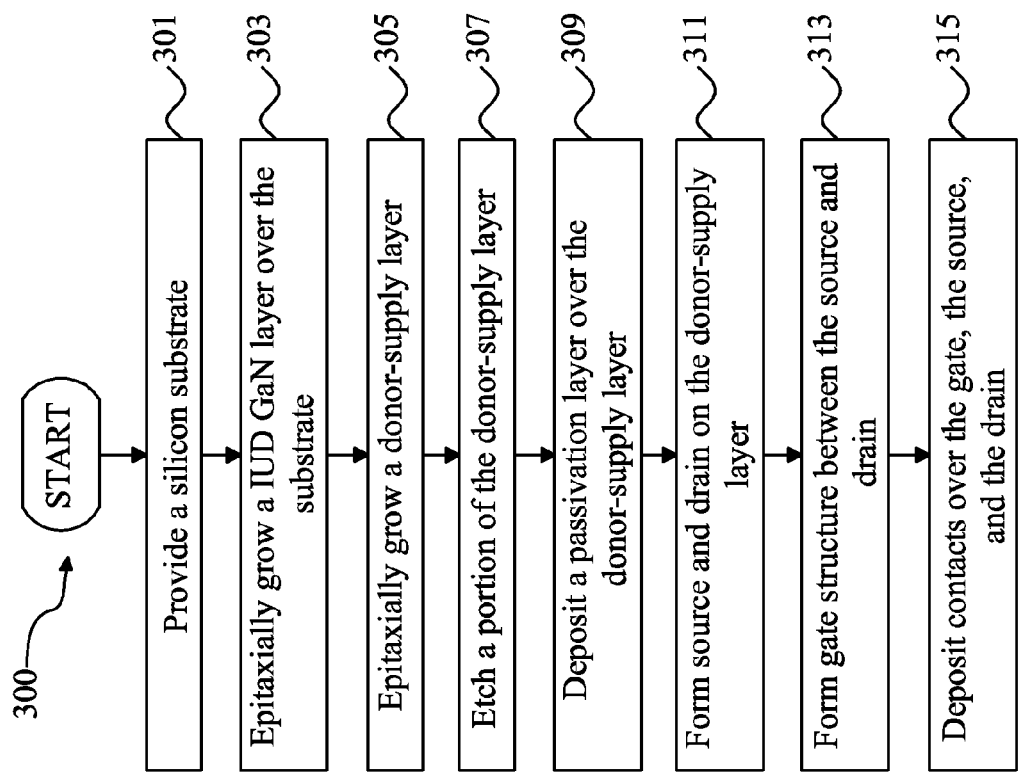
FIG. 3 is a flow chart of methods for forming a HEMT structure in accordance with certain embodiments of the present disclosure.
Figure 4:
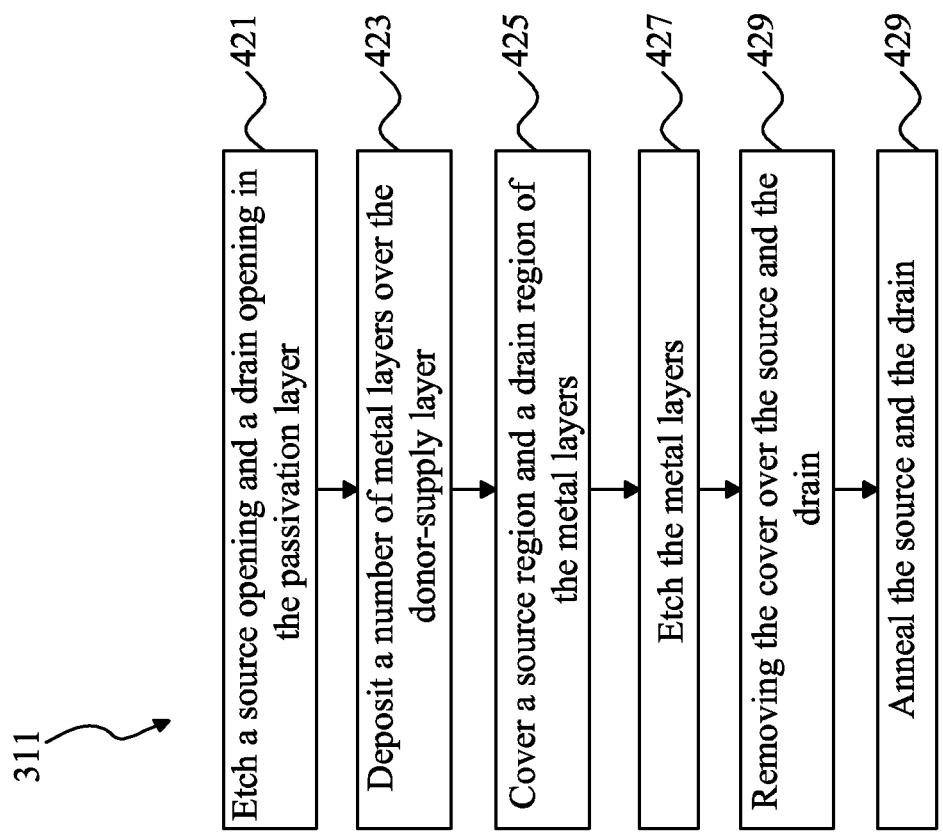
FIG. 4 is a flow chart of methods for forming a HEMT structure in accordance with certain embodiments of the present disclosure.

FIGS. 3 and 4 are process flow charts that illustrate various operations of a method to form the HEMTs of the present disclosure. FIGS. 3 and 4 are discussed in association with FIGS. 5A to 5E that shows a partially fabricated HEMT in various stages of manufacturing. FIG. 3 illustrates a process flow 300 that describes operations to make a HEMT in accordance with various embodiments of the present disclosure. In the first operation 301, a silicon substrate is provided. FIGS. 5A to 5E show the silicon substrate 501. Note that the various elements in the figures are not drawn to scale. While HEMTs are often manufactured on a substrate other than silicon substrate, such as sapphire and silicon carbide, the methods and structures disclosed herein are specific silicon fabrication processes and silicon-based structures.

Referring to FIG. 3, in operation 303, a bulk layer of undoped gallium nitride (UID GaN) is epitaxially grown over the silicon substrate. The UID GaN layer is shown in FIGS. 5A to 5E as layer 509 over the silicon substrate 501. The bulk layer of undoped gallium nitride 509 is epitaxially grown over the silicon substrate 501, which may include intervening layers such as a nucleation layer and/or a buffer layer. The bulk layer of gallium nitride 509 does not include any dopant, but may include contaminants or impurities that are incorporated in the film unintentionally. The bulk layer of gallium nitride may be referred to as unintentionally doped gallium nitride (UID GaN) layer. The UID gallium nitride may be about 0.5 microns to about 1 micron thick. The bulk GaN layer is grown under high temperature conditions. The process may be metal organic CVD (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HVPE), chloride vapor-phase epitaxy (Cl-VPE), and/or liquid phase epitaxy (LPE). Using metal organic vapor phase epitaxy (MOVPE) involves a gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), trimethylaluminum (TMA), phenyl hydrazine, or other suitable chemical.

Referring to FIG. 3, in operation 305, a donor-supply layer is grown over the UID GaN layer. The donor-supply layer is shown in FIGS. 5A to 5E as layer 511 over the UID GaN layer 509. The donor-supply layer 511 can be epitaxially grown on the GaN layer 509 by MOVPE using an aluminum-containing precursor, a gallium-containing precursor, and a nitrogen-containing precursor. The aluminum-containing precursor includes TMA, TEA, or other suitable chemical. The gallium-containing precursor includes TMG, TEG, or other suitable chemical. The nitrogen-containing precursor includes ammonia, tertiarybutylamine (TBAm), phenyl hydrazine, or other suitable chemical.

The band gap discontinuity between the donor-supply layer 511 and the UID GaN layer 509 forms a carrier channel 513 at the interface between the two layers 511 and 509. The carrier channel 513 is al called a two-dimensional electron gas (2-DEG), where electrons have high mobility when the transistor is on.

Figure 5B:
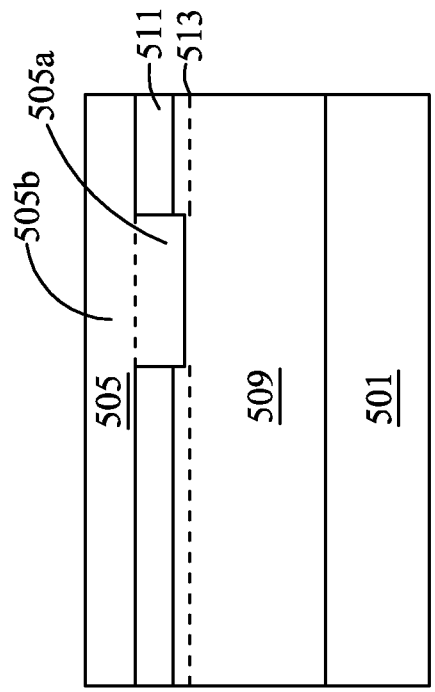
FIGS. 5A to 5E are cross section schematics of a HEMT in various stages of formation according to method embodiments of the present disclosure.
Figure 5A:
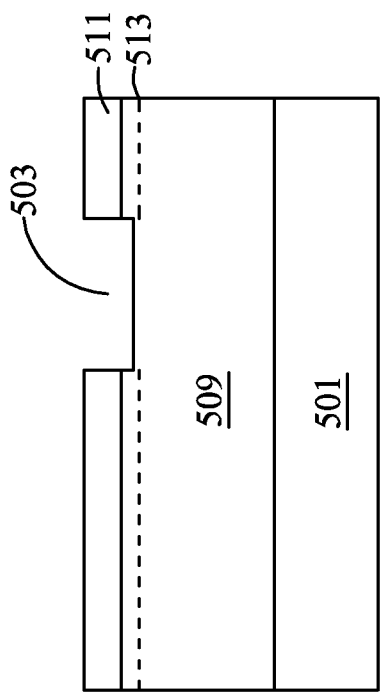

Referring to FIG. 3, in operation 307, a portion of the donor-supply layer 511 is etched to a level at a top surface of the UID GaN layer 509, slightly below, or slightly above—leaving a small portion of the donor-supply layer 511 remaining. As discussed herein in association with FIGS. 1A and 1B, various embodiments of the present disclosure include devices that have patches of non-conduction in the carrier channel layer by removing sufficient amounts of the donor-supply layer 511 such that the 2-DEG carrier channel 513 does not form. As shown in FIG. 5A, the carrier channel layer 513 is discontinuous at the cross section shown because all of the donor-supply layer 511 in an opening 503 is removed.

A photoresist layer may be first deposited and patterned to protect parts of the donor-supply layer that are not to be etched. The etch pattern may be one of the various configurations from FIGS. 2A and 2B, or others as discussed or designed by one skilled in the art according to the inventive concepts in this disclosure. Once a sufficient amount of the donor-supply layer 511 is removed, additional etching does not change the electrical properties of the final device. Thus, a fast etch process with small amount of over etching may be used. While other methods and structures using buried oxide layers involve careful etching to not over etch the donor-supply layer, the methods in accordance with various embodiments of the present disclosure do not require such careful etching. As result, one of the advantages of various embodiments of the present disclosure is a larger process window for the method of making the power device. In some embodiments, a fluorine-based etchant or a chlorine-based etchant is used in a plasma to etch the opening. In some embodiments, the etch process may be very fast initially, but as the bottom of the etched opening approaches the UID GaN layer 509, the process may be slowed down, for example, the plasma power and pressure may be reduced in the chamber. FIG. 5A shows the partially fabricated HEMT with an opening 503 in the donor-supply layer 511. Although only one opening 503 is shown, various embodiments include any number of at least one opening as discussed in association with FIGS. 2A and 2B.

Once the openings or cavities are formed in the donor-supply layer, the photoresist protecting parts of the donor-supply layer is removed. In operation 309, a passivation material layer is deposited over the donor-supply layer and in the opening. As shown in FIG. 5B, a passivation material 505 is deposited. The passivation material 505 fills the openings etched in operation 307 of FIG. 3 and completely covers the donor-supply layer. The dielectric layer may be silicon oxide, silicon nitride, silicon oxynitride, carbon doped silicon oxide, carbon doped silicon nitride, carbon doped silicon oxynitride, zinc oxide, zirconium oxide, hafnium oxide or titanium oxide. The dielectric layer is deposited using a process such as chemical vapor deposition (CVD).

The passivation material 505 is deposited in one operation and forms a single material layer. A first portion 505a of the passivation material 505 is located in the etched portions of the donor-supply layer and fills the opening 503. A bottom surface of the first portion 505a may contact the UID GaN layer 509 or a small remaining portion of the donor-supply layer 511 (for example, about or less than 3 nm). A second portion 505b of the passivation material 505 is located above the donor-supply layer 511. A top surface of the second portion 505b is relatively flat even over the opening because the etched openings 503 have low aspect-ratios.

Figure 5C:
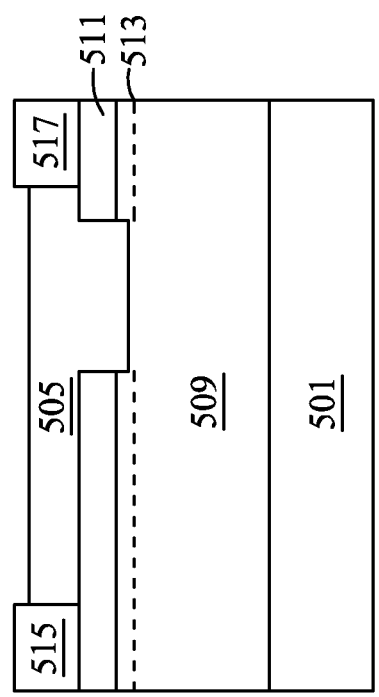
Figure 5E:
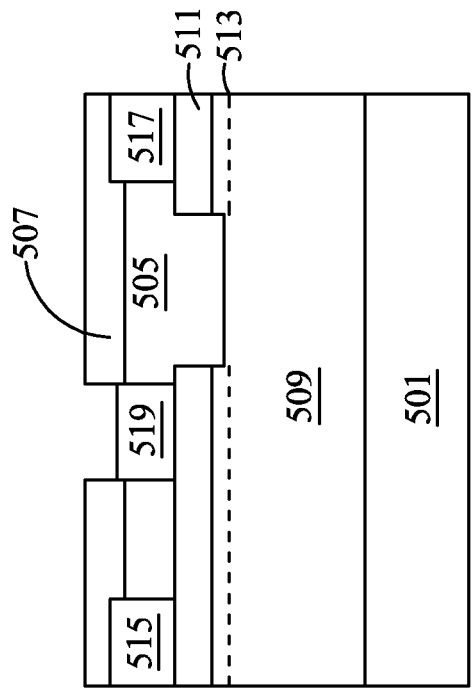

In operation 311, a source and a drain is formed on the donor-supply layer. FIG. 5C shows the source 515 and the drain 517 on the donor-supply layer 511. In some embodiments, the source 515 and the drain 517 are intermetallic compounds or alloys. The intermetallic compound may be formed by constructing a patterned metal layer over the donor supply layer 511 or fully or partially in a cavity of the donor-supply layer 511. The patterned metal layer may then be annealed such that the metal layer, the donor-supply layer 511 and optionally the GaN layer 509 react to form the intermetallic compound. Because of the anneal, the metal elements in the intermetallic compound may diffuse into the donor-supply layer 511 and the GaN layer 509. The intermetallic compound contacts the carrier channel 513 located at the interface of the donor-supply layer 511 and the GaN layer 509. The intermetallic compound may improve electrical connection and form ohmic contacts between the source/drain features and the carrier channel 513. In one example, the intermetallic compound is formed in the cavity of the donor-supply layer 511 as well as a portion of the donor-supply layer around the cavity such that the intermetallic compound follows the contour of the donor-supply layer 511 and has a non-flat top surface. In another example, intermetallic compound overlies a portion of the AlGaN layer 511.

FIG. 4 further separates the operation 311 into detailed sub-operations. In operation 421, a source opening and a drain opening are etched in the passivation material layer. A photoresist or etch mask is first deposited to protect portions of the passivation layer not to be etched. A dry etch process may be used to form the source opening and drain opening.

In operation 423, a number of metal layers are deposited over the donor-supply layer and in openings etched in the donor-supply layer for the source and the drain. The metal layers may include titanium, aluminum, and copper. In one example, the metal layers are a titanium, aluminum, and titanium stack. The metal layers are deposited using a physical vapor deposition (PVD) process. A plasma is formed in a chamber proximate to a target containing the metal to be deposited. Ions in the plasma bombard the target causing metal particles to sputter off. The sputtered metal particles deposit onto the substrate forming a metal layer. The metal layers conform to the surface topography of the donor-supply layer and the openings.

In operation 425, a source region and a drain region of the metal layer are covered. Usually, a photolithographic process is used to cover the metal layers to be protected. A photoresist is deposited and exposed to a light pattern that modifies the property of the photoresist. Depending on the type of photoresist, exposed portions or unexposed portions are removed by developing the photoresist, leaving only some photoresist on the metal layers. The covering is used as a mask in subsequent processing. Other materials such as a patterned hardmask may be used also. The hardmask would be deposited first, patterned, and etched to define the source and drain.

In operation 427, the metal layers are etched. The mask or photoresist from operation 425 is an etch mask that protects the source and drain from being removed. Dry etch using plasma removes the metal layers that are not protected, down to the donor-supply layer. Suitable plasma etch techniques include a reactive ion etch (RIE) and an inductively coupled plasma (ICP) etch. Depending on the etch selectivity of the metal over the underlying passivation material layer, the metal layer may be slightly over-etched to ensure complete removal of the metal layers over the passivation material layer 505.

In operation 429, the covering over the source and the drain is removed. If the covering is photoresist, then the removal process is ashing and stripping. If the covering is a hardmask, then the removal process may involve etching with different plasma etchants from that of operation 427. At this point the partially fabricated structure resembles the structure of FIG. 5C. Thereafter in operation 429, the source and the drain may be annealed in a rapid thermal anneal (RTA) process. Annealing can create an intermetallic compound or an alloy. In one embodiment, an alloy is created in an inert environment at about 800 to 900 degrees Celsius. In another embodiment, an intermetallic compound containing nitrogen is created in a nitrogen environment. Other annealing environments include an oxygen environment for creating some conductive oxides and an ambient environment. As discussed, annealing the source and drain may also allow interaction of the metal layers with underlying material from the donor-supply layer. The result may be a source and drain that includes material from the underlying layers. In effect, a larger source and/or drain than the metal layers are created because some metal diffuses into the donor-supply layer and some aluminum, gallium, and nitrogen diffuses into the source and the drain.

Figure 5D:
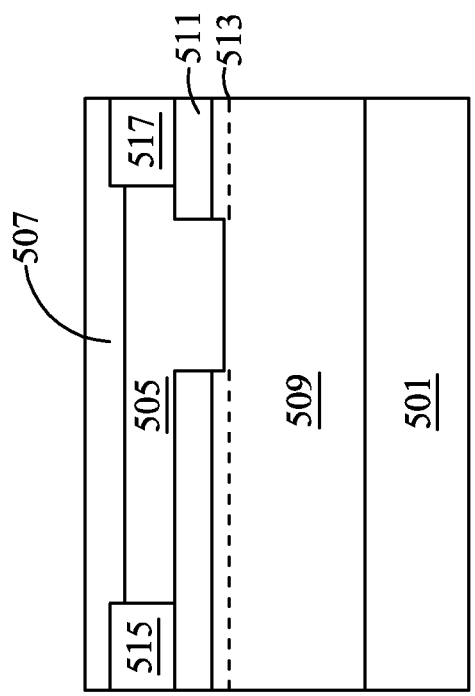

As shown in FIG. 5D, after forming the source 515 and drain 517, a dielectric layer 507 may be deposited over the source, drain, and the passivation material. However, the dielectric layer 507 is optional and in some cases may be of the same material as the passivation material layer 505.

Referring to FIG. 3, in operation 313, a gate structure is formed between the source and the drain. Similar to the source/drain formation process, the gate structure is formed in a number of steps. According to some embodiments, the gate structure may be defined first by a photolithography process through the passivation material 505 and dielectric 507. The gate material is then deposited in a CVD process or a metal CVD process over the donor-supply layer. As discussed, the gate material may include one or more of tungsten (W), titanium nitride (TiN) and tantalum (Ta). Excess gate material is then etched away to achieve the structure of FIG. 5E. The structure of FIG. 5E includes a gate structure 519 between a source 515 and a drain 517 over the donor-supply layer 511.

Referring to FIG. 3, in operation 315, contacts are deposited over the gate, the source, and the drain. A photoresist is deposited and patterned to expose the source, the drain, and the gate structure. The dielectric layer over the source, the drain, and the gate structure are removed with an etch process. After the basic HEMT structure is formed, subsequent operations include depositing contacts and first layer of metal interconnect along with intermetallic dielectric (IMD) material using suitable semiconductor processes and designs.

Figure 6A:
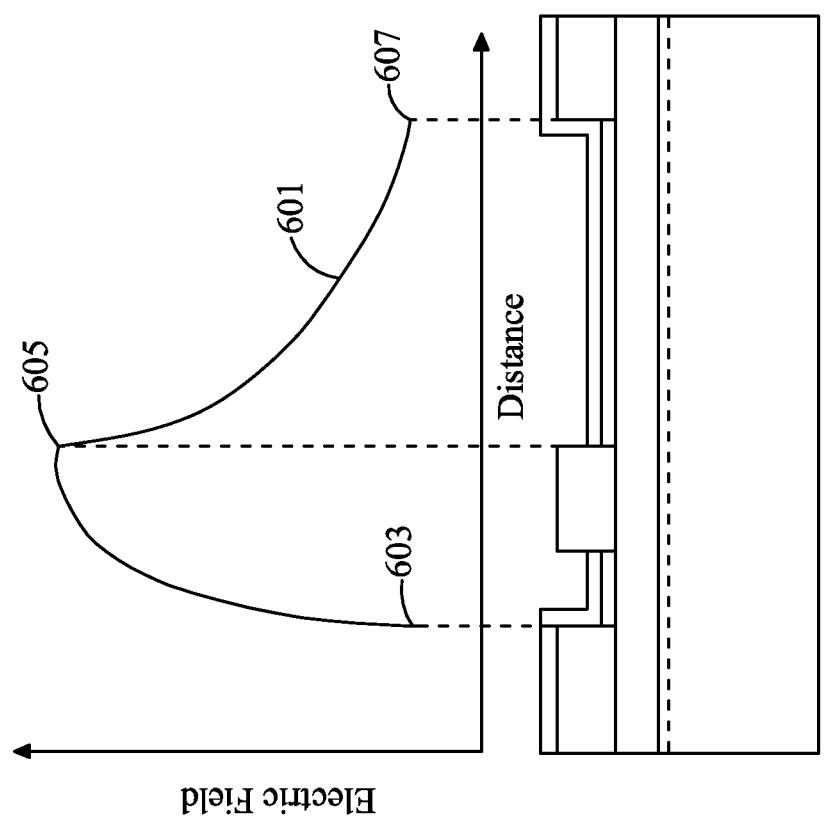
FIGS. 6A and 6B are plots of electric field versus distance for a comparative HEMT and a HEMT in accordance with the present disclosure.
Figure 6B:
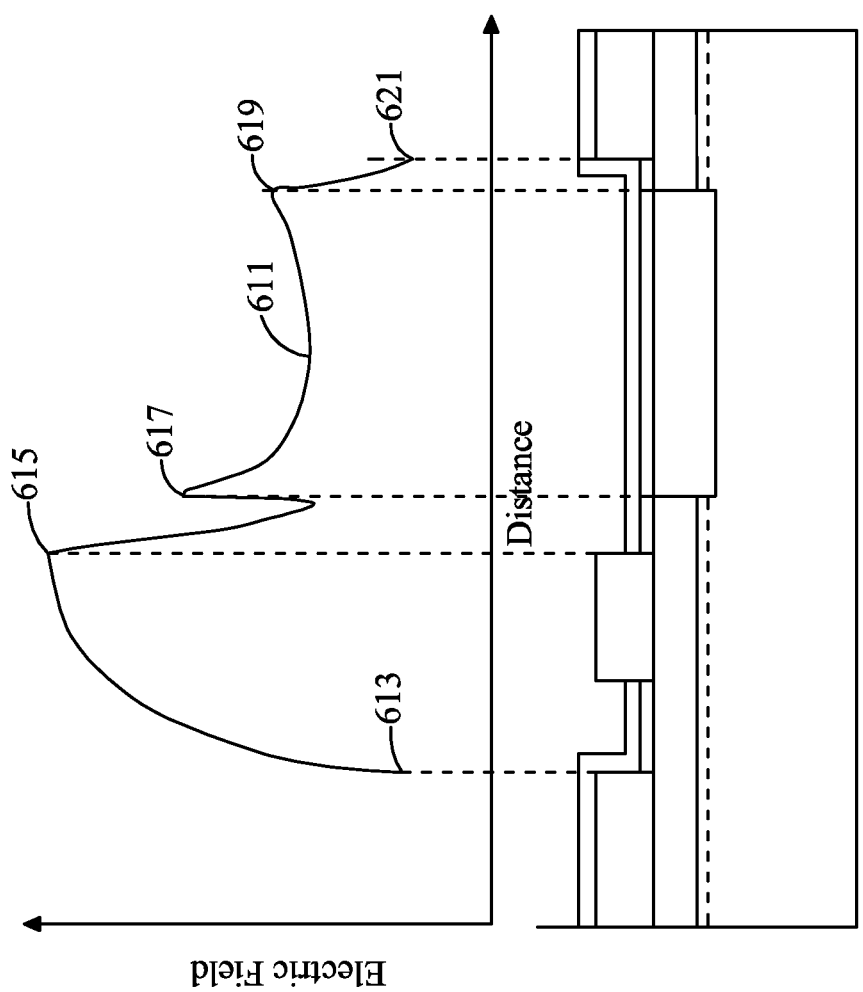

FIGS. 6A and 6B are representations of surface electric field as a function of distance on the HEMT structures in accordance with various embodiments of the present disclosure. Electric field is usually represented in volts per centimeter in a logarithmic scale and is plotted against a distance along a line across the HEMT. The surface electric field in FIGS. 6A and 6B are shown against the device elements with dotted lines. Line 601 of FIG. 6A represents a comparative HEMT without the buried portions as disclosed herein. Point 603 represents the source edge closest to the gate. Point 605 corresponds to the gate structure edge closest to the drain. Point 607 corresponds to the drain edge closest to the gate. FIG. 6A shows that the surface electric field is highest at the gate edge closest to the drain.

FIG. 6B represents a HEMT having a buried portion in accordance with various embodiments of the present disclosure. Line 611 is the surface electric field. Point 613 represents the source edge closest to the gate. Point 615 corresponds to the gate structure edge closest to the drain. Point 617 represents the edge of the buried portion closest to the gate. Point 619 represents the edge of the buried portion closest to the drain. Point 621 corresponds to the drain edge closest to the gate. Comparing FIGS. 6A and 6B, the peak surface electric field are both at the gate edge closest to the drain, points 605 and 615 respectively. The intensity of the peak surface electric fields are about the same, as the buried portions do not affect the surface electric field at the gate edge. In other words, having the buried portions as disclosed herein does not change the breakdown voltage threshold as is affected by the gate edge surface electric field. However, the buried portions affect the surface electric field in the drift region between the gate and the drain. As shown in FIG. 6B, the surface electric field across the HEMT is increased over the portions of the drift region where the buried portions lie. Thus, the overall electric field at the surface is increased for the device without affecting the peak electric field.

The embodiments of the present disclosure may have other variations. For example, the buried portions may include more than one material, such as a layer of nickel oxide over a layer of gallium nitride. Certain embodiments of the present disclosure have several advantageous features. The use of various doping species allows fine-tuning of the buried portions, and hence the breakdown voltage, while minimizing adverse effects to other electrical properties, such as maximum forward current or leakage current.

One aspect of this description relates to a method comprising epitaxially growing a gallium nitride (GaN) layer over a silicon substrate, epitaxially growing a donor-supply layer over the GaN layer, and etching a portion of the donor-supply layer. The method also comprises depositing a passivation layer over the donor-supply layer and filling the etched portion of the donor-supply layer, forming a source and a drain on the donor-supply layer, and forming a gate structure between the source and the etched portion of the donor-supply layer. The method further comprises depositing contacts over the gate structure, the source, and the drain.

Another aspect of this description relates to method comprising epitaxially growing an unintentionally doped gallium nitride (UID GaN) layer over a silicon substrate, epitaxially growing a donor-supply layer over the UID GaN layer, and forming a carrier channel layer at an interface of the UID GaN layer and the donor-supply layer. The method also comprises forming a gate structure, a drain, and a source over the donor-supply layer, said gate structure disposed between the drain and the source, and depositing a passivation layer over the donor-supply layer between the gate structure and the drain. The passivation layer has a dielectric constant less than that of the donor-supply layer. The carrier channel layer has a smaller surface area than the UID GaN layer in a drift region between the gate structure and the drain.

Still another aspect of this description relates to method comprising epitaxially growing an unintentionally doped gallium nitride (UID GaN) layer over a silicon substrate, epitaxially growing a donor-supply layer over the UID GaN layer, and forming a carrier channel layer at an interface of the UID GaN layer and the donor-supply layer. The method also comprises forming a gate structure, a drain, and a source over the donor-supply layer, said gate structure disposed between the drain and the source, wherein the donor-supply layer has one or more through-holes in a drift region between the gate structure and the drain, and depositing a passivation layer over the donor-supply layer and filling the one or more through-holes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
epitaxially growing a gallium nitride (GaN) layer over a silicon substrate;
epitaxially growing a donor-supply layer over the GaN layer;
forming a carrier channel layer at an interface of the GaN layer and the donor-supply layer;
etching a portion of the donor-supply layer;
depositing a passivation layer over the donor-supply layer and filling the etched portion of the donor-supply layer;
forming a source and a drain on the donor-supply layer;
forming a gate structure between the source and the etched portion of the donor-supply layer;
depositing contacts over the gate structure, the source, and the drain; and
forming non-conductive patches in a drift region,
wherein an entirety of at least one of the non-conductive patches is formed between an edge of the gate structure and an edge of the drain in the drift region in a top side view, and forming the non-conductive patches causes the carrier channel layer to be discontinuous in the drift region.

2. The method of claim 1, wherein the etching a portion of the donor-supply layer completely removes the portion of the donor-supply layer to expose the GaN layer.

3. The method of claim 1, wherein the GaN layer comprises unintentionally doped gallium nitride and the donor-supply layer comprises AlxGa(1-X)N, wherein x is between 0.1 and 1.

4. The method of claim 1, wherein the forming a source and a drain on the donor-supply layer comprises:
etching a source opening and a drain opening in the passivation layer;
depositing a plurality of metal layers over the passivation layer and in the source opening and the drain opening;
covering a source region and a drain region of the plurality of metal layers;
etching the plurality of metal layers into a source and a drain;
removing the cover over the source and the drain; and
annealing the source and drain.

5. The method of claim 1, wherein the passivation layer is one or more layers selected from a group consisting of zinc oxide, zirconium oxide, hafnium oxide, and titanium oxide.

6. A method comprising:
epitaxially growing an unintentionally doped gallium nitride (UID GaN) layer over a silicon substrate;
epitaxially growing a donor-supply layer over the UID GaN layer;
forming a carrier channel layer at an interface of the UID GaN layer and the donor-supply layer;
forming a gate structure, a drain, and a source over the donor-supply layer, said gate structure disposed between the drain and the source; and
depositing a passivation layer over the donor-supply layer between the gate structure and the drain, the passivation layer having a dielectric constant less than that of the donor-supply layer,
wherein the carrier channel layer has a smaller surface area than the UID GaN layer in a drift region between the gate structure and the drain.

7. The method of claim 6, wherein a minimum width of the carrier channel layer is formed to be 50% or greater than the width of the UID GaN layer.

8. The method of claim 6, wherein the donor-supply layer is discontinuous in the drift region.

9. The method of claim 8, wherein the passivation layer is deposited having one or more first portions contacting the UID GaN layer through one or more discontinuities in the donor-supply layer and a second portion over the first portion and the donor-supply layer.

10. The method of claim 9, wherein the one or more first portions of the passivation layer are formed as quadrilaterals in a top view.

11. The method of claim 10, wherein none of the one or more first portions of the passivation layer are formed adjoining the gate.

12. The method of claim 6, wherein one or more portions of the donor-supply layer in the drift region are formed having a thickness about or less than 3 nanometer.

13. The method of claim 10, wherein the passivation layer is formed to have one or more first portions in the donor-supply layer and a second portion over the first portion and the donor-supply layer.

14. The method of claim 6, wherein the passivation layer is deposited as having one or more of silicon oxide, silicon nitride, silicon oxynitride, carbon doped silicon oxide, carbon doped silicon nitride, or carbon doped silicon oxynitride.

15. The method of claim 6, further comprising:
depositing a buried oxide layer adjoining a gate edge, said buried oxide layer being surrounded by the donor-supply layer.

16. The method of claim 6, further comprising:
forming a field plate over the gate structure.

17. The method of claim 6, wherein the donor-supply layer is formed comprising undoped aluminum nitride or undoped aluminum gallium nitride.

18. A method comprising:
epitaxially growing an unintentionally doped gallium nitride (UID GaN) layer over a silicon substrate;
epitaxially growing a donor-supply layer over the UID GaN layer;
forming a carrier channel layer at an interface of the UID GaN layer and the donor-supply layer;
forming a gate structure, a drain, and a source over the donor-supply layer, said gate structure disposed between the drain and the source, wherein the donor-supply layer has one or more through-holes in a drift region, the drift region being between an edge of the gate structure and an edge of the drain in a top-side view; and
depositing a passivation layer over the donor-supply layer and filling the one or more through-holes.

19. The method of claim 18, wherein a minimum width of the carrier channel layer is formed to be about 50% to about 90% of the width of the UID GaN layer.

20. The method of claim 18, wherein the passivation layer is formed having a dielectric constant less than about 9.

\* \* \* \* \*